United States Patent [19]

Kinsman

[11] Patent Number: 4,785,270
[45] Date of Patent: Nov. 15, 1988

[54] MONOLITHIC LATTICE SAW FILTER

[75] Inventor: Robert G. Kinsman, Naperville, Ill.

[73] Assignee: Motorola Inc., Schaumburg, Ill.

[21] Appl. No.: 139,419

[22] Filed: Dec. 30, 1987

[51] Int. Cl.[4] .......................... H03H 9/56; H03H 9/60; H03H 9/64

[52] U.S. Cl. .................................... 333/193; 333/190; 333/191; 310/313

[58] Field of Search ............... 333/190, 191, 193, 194, 333/195, 196, 150–155, 192, 187–189; 310/313 R, 313 A, 313 B, 313 C, 313 D

[56]         References Cited
         U.S. PATENT DOCUMENTS

| 3,942,140 | 3/1976  | Laker et al.     | 333/193   |
| 4,126,837 | 11/1978 | Koyamada et al.  | 333/193   |
| 4,298,849 | 11/1981 | Arneson          | 333/193   |
| 4,390,854 | 6/1983  | Colvin           | 333/196 X |
| 4,468,642 | 8/1984  | Hikata           | 333/193   |
| 4,492,940 | 1/1985  | Hikata           | 333/194   |

FOREIGN PATENT DOCUMENTS 0964976 10/1982 U.S.S.R. ............................ 333/195

OTHER PUBLICATIONS

V. M. Ristic and M. Yamauchi, "High Q SAW Filter for VHF Band," Proc. 1975 IEEE Ultrasonics Symposium, 315–316, (1975).

W. P. Mason, "Electromechanical Transducer and Wave Filters," 2nd Ed., Van Nostrand, New York, pp. 248–263, (1948).

F. Ishihara et al., "Narrow Band Filters Using SAW Resonators," Prod. 1975 IEEE Ultrasonics Symposium, 381–384, (1975).

M. Hikata et al., "Miniature SAW Antenna Duplexer for Portable Telephone," 1987 IEEE MTT-S Int'l Microwave Digest, 797–800, (Jun. 1987).

W. J. Tanski, "Multipole SAW Resonator Filters," Proc. 36th Annual Frequency Control Symposium, 400–404, (Jun. 14, 1982).

Primary Examiner—Marvin L. Nussbaum
Attorney, Agent, or Firm—José W. Jimenez

[57]         ABSTRACT

A monolithic lattice SAW bandpass filter having low insertion loss and a wide bandwidth range is described herein. Specifically, the bandpass filter includes a monolithic piezoelectric substrate and two dual port SAW device disposed on the substrate and coupled in a full lattice circuit configuration. In a second bandpass filter design the filter includes a monolithic substrate and two sets of dual port SAW devices disposed on the substrate and coupled in a cascaded circuit configuration such that no electrical crossovers occurs on the substrate.

17 Claims, 1 Drawing Sheet

U.S. Patent    Nov. 15, 1988    4,785,270
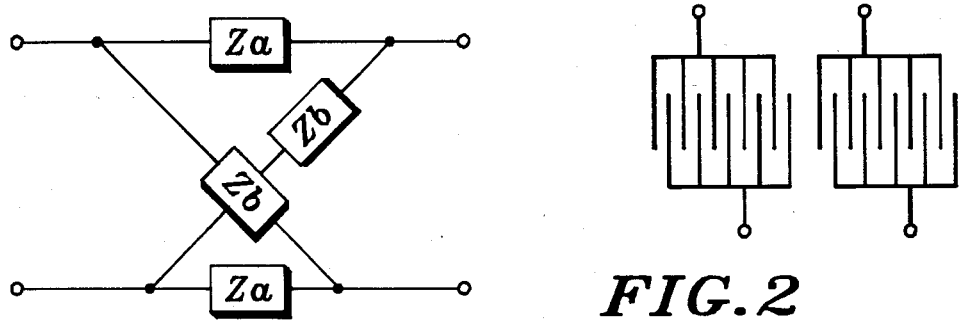
FIG. 1
—PRIOR ART—
FIG. 2
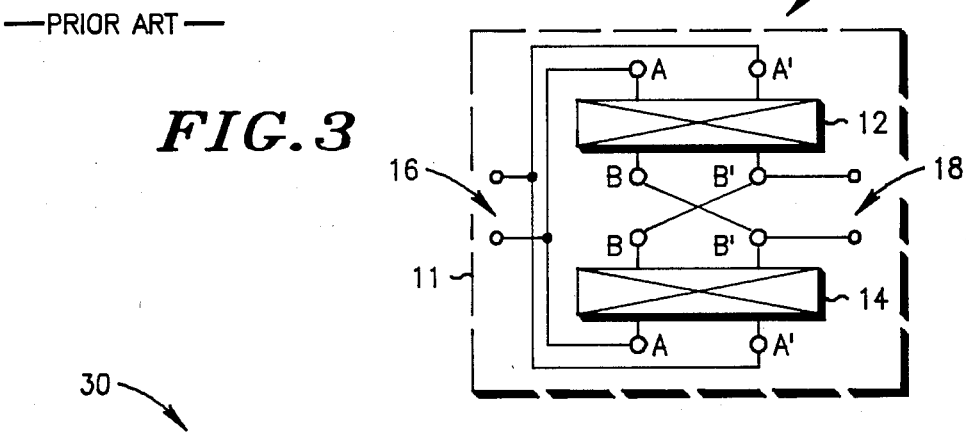
FIG. 3
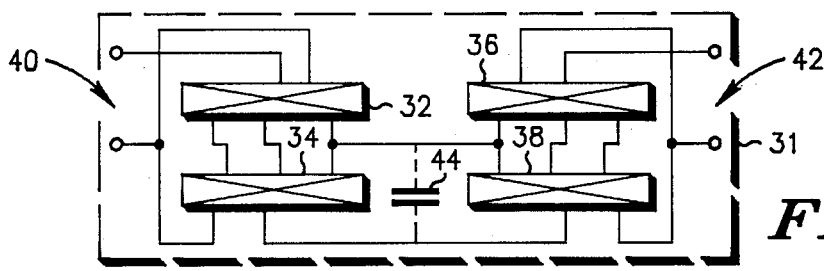
FIG. 4
FIG. 5

MONOLITHIC LATTICE SAW FILTER

BACKGROUND OF THE INVENTION

The present invention generally relates to bandpass filters and in particular to an improved SAW bandpass filter with very low insertion loss.

SAW devices have traditionally been used in transversal type filters. The key element in SAW filter design is the interdigital transducer (IDT); it converts the electrical signal to the acoustic waveform and thereby determines the filter impedance and frequency response. In the conventional filter arrangement the power is divided by the launching transducer. Half is usually sent toward an absorber and half propagates towards the output. At the output transducer, some of the signal (at most half) is delivered to the load, some passes the transducer and is absorbed, and some is reflected. In instances where the signal reflected by the output IDT reaches the input IDT part of it is reflected back to the output. The doubly reflected signal is detected at the output and causes passband ripple.

One solution to this problem of having either high insertion loss or significant ripple is to use unidirectional transducers to couple all of the electrical energy into a single acoustic wave. Unidirectional transducers, however, are made with phased arrays of electrodes, usually three or four electrodes per wavelength, which tends to complicate the fabrication process by introducing multiple layers of metalization. Such an arrangement may also limit filter bandwidth and increase the component count.

SAW filters in use today consist mainly of two basic types: (1) Transversal filters which include a sending and a receiving transducer on a single substrate. The selectivity characteristics are determined by the number of finger pairs in the transducers and by the finger overlap geometry or "weighting". Insertion loss tends to be high because simple transducers are bidirectional i.e. one half the input power is transmitted in each of two opposite directions. Various methods have been devised to lower insertion loss such as unidirectional transducers and multiple element transducers in parallel. However each of these methods has severe design restrictions and tend to be effective only over a limited bandwidth and/or center frequency range. (2) Coupled resonator filters which include a minimum of two acoustically coupled SAW resonators. They are basically the equivalent of monolithic crystal filters. The coupled bandwidth is controlled by the individual resonator geometries and their separation. Bandwidths are limited to relatively narrow values and design optimization will appear to require several iterations.

SUMMARY OF THE INVENTION

It is the object of this invention to provide an improved bandpass filter which utilizes SAW type devices in a full lattice circuit arrangement.

It is also an object of this invention to provide a monolithic bandpass filter with all of the devices and interconnects on a single substrate without having electrical crossovers on the substrate.

In accordance with one aspect of this invention, there is provided a bandpass filter that comprises a monolithic piezoelectric substrate and first and second dual port SAW devices disposed on the substrate and coupled in a full lattice circuit configuration. The first lead of the input of the filter is coupled to the second inputs of the first and second SAW devices and the second lead of the input of the filter is coupled to the first inputs of the first and second SAW devices. The first input of the first SAW device is coupled to the second output of the second SAW device to form the first lead of the filter output. The first output of the second SAW device is coupled to the second output of the first SAW device to form the second filter output.

In accordance with another aspect of this invention, there is provided a bandpass filter comprising a monolithic piezoelectric substrate and a first and second set of elements disposed on the substrate and coupled in a cascaded circuit configuration. Each of the set of elements is comprised of first and second dual port SAW device electrically coupled to one another. The first set of elements is coupled to the input of the filter and is coupled to the second set of elements. The second set of elements is couple to the output of the filter.

BRIEF DESCRIPTION OF THE DRAWINGS

FIG. 1 illustrates a lattice circuit using elements Za and Zb.

FIG. 2 illustrates a dual port SAW transducer.

FIG. 3 illustrates a lattice circuit diagram with two dual port SAW devices designed according to the teachings of the present invention.

FIG. 4 illustrates a four pole cascaded filter utilizing dual port devices according to the teachings of this invention.

FIG. 5 illustrates the frequency response for a two pole lattice filter according to the teachings of the present invention.

DETAILED DESCRIPTION OF THE PREFERRED EMBODIMENT

For a better understanding of the present invention together with other and further advantages and capabilities thereof, reference is made to the following disclosure and appended claims in connection with the above described drawings.

SAW resonators are known to exhibit a certain level of resonance that may be useful in certain filters. However, less is known about other SAW devices used in filters. With respect to SAW transducers, the equivalent electrical circuit of an unweighted SAW transducer is, in essence, the same as that of a quartz crystal. A two pole filter may also be designed in a manner that is similar to a crystal filter.

In the proposed filter, SAW devices are used as individual resonators in a full lattice circuit. FIG. 1 represents a full lattice circuit having two Za elements and two Zb elements. In a two pole filter, such a full lattice circuit arrangement would be rather inefficient since four resonators would be required. However, due to the fact that two identical Za and two identical Zb arms exist in the circuit it is possible to use one resonator in two places. This could be accomplished by providing two ports for each resonator or device.

Referring to FIG. 2, there is illustrated a dual port SAW transducer of the type that can be used as a resonator element in a lattice configuration, as in FIG. 3, or in a cascaded configuration, as in FIG. 4.

Referring now to FIG. 3, there is illustrated a bandpass filter 10 that is disposed on a substrate 11, which is a monolithic piezoelectric substrate. Filter 10 includes two dual port SAW devices 12 and 14 which are disposed on substrate 11 and are coupled in a full lattice circuit configuration. The first lead of input 16 of filter 10 is coupled to the second inputs, designated as A', of device 12 and device 14. The second lead of input 16 of filter 10 is coupled to the first input, designated A, of devices 12 and 14. The first output of device 12, designated B, is coupled to the second output of device 14, designated B', to form the first lead of filter output 18. The first output of device 14, designated B, is coupled to the second output of device 12, which is designated B', to form the second lead of filter output 18.

As illustrated in FIG. 3, a lattice configuration utilizing dual port SAW devices as elements in the circuit reduces the number of elements required in a filter and reduces the overall size of the filter. For instance, a dual port device for device 12 substitutes for the two Za elements illustrated in FIG. 1. For a one pole filter, device 12 would be a two port SAW device and device 14 would be comprised of two capacitors. In a two pole filter, devices 12 and 14 would comprise dual port SAW transducers or dual port SAW resonators. It is possible to increase the number of poles in this filter by connecting a plurality of SAW devices in parallel for either device 12 or 14 or both. For example, a four pole bandpass filter could be designed which is comprised of two dual port SAW transducers coupled in parallel for device 12 and two dual port SAW transducers coupled in parallel for device 14. To have filter 10 interface with other components, input 16 and output 18 may be coupled to external push-pull circuits or to an external transformer circuit.

In furtherance of the teachings of the present invention, there is provided a monolithic SAW filter device with no electrical crossovers on the substrate. This feature of no electrical crossovers becomes increasing important at higher frequencies and is provided in a four pole filter (illustrated in FIG. 4). In FIG. 4 a bandpass filter 30 is illustrated which is formed on a substrate 31, that is comprised of a monolithic piezoelectric substrate. Filter 30 is further comprised of a first and second set of elements disposed on substrate 31 and coupled in a cascaded circuit configuration. Each of the set of elements is comprised of two dual port SAW devices which are electrically coupled to one another. The first set of elements, which is comprised of two dual SAW devices 32 and 34, is coupled to the input 40 of filter 30 and is coupled to the second set of elements. The second set of elements, which is comprised of two dual port SAW devices 36 and 38, are coupled to the output 42 of filter 30.

Filter 30 may include a plurality of sets of dual port SAW devices disposed on substrate 31 and coupled in a cascaded circuit configuration if filters with a greater number of poles are required for higher frequencies. For filters at less than a maximum bandwidth, some capacitance, such as capacitor 44, would be required at the center junction. This could be supplied by additional electrodes on the substrate. The input and output terminations of filter 30 can not have a common ground, therefore coupling transformers would be required for at least one port.

Referring further to FIG. 4, the output of devices 32 and 34 are coupled to one another and the outputs of devices 36 and 38 are also coupled to one another. The two sets of elements are electrically coupled to each other by coupling one input of device 34 and one input of device 38 to one another and coupling the outputs of devices 32, 34, 36 and 38 as illustrated in FIG. 4. For a four pole filter the SAW devices in FIG. 4 may comprise either dual port SAW transducers or dual port SAW resonators. For higher order filter designs the dual port SAW devices may comprise a plurality of dual port SAW transducers coupled in parallel.

The use of unweighted SAW transducers does present some problems. The reactance of the transducer increases relatively linearly with frequency. However, the equivalent resistance cycles between zero and an upper limit as a function of frequency. This characteristic causes ripples in the filter frequency response. To illustrate this problem a zero (0)dB or Butterworth design was used so all of the passband ripple can be attributed to the transducer variation. By shifting the relative frequency of two transducers slightly, it has been found that passband ripple can be reduced. This response is shown in FIG. 5 for a two pole lattice filter using 500 finger pair SAW transducers. In a filter using 1000 finger pair transducers the passband ripple is substantially reduced. In a four pole cascaded lattice filter using 1000 finger pair transducers on lithium tantalum oxide (LiTaO$_3$) the passband ripple was reduced. In such a four pole filter design two identical sections are cascaded and by slightly staggering the frequencies of the two sections the passband ripple can be minimized.

In one embodiment of the invention, the monolithic SAW filter was designed with the following parameters: a two (2) pole Butterworth filter having a center frequency of about 100 MHz and a 3 dB bandwidth of about 2 MHz. Dual port SAW transducers, of the type illustrated in FIG. 2, were used that were fabricated on LiTaO$_3$ substrates having a 36° rotated Y cut. Five hundred (500) finger pairs per transducer were used, with each transducer having an aperature of about 640 micrometers. The synchronism frequency of the Za transducer (or device 12) was about 98.98 MHz and the synchronism frequency of the Zb transducer (or device 14) was about 100.28 MHz. The terminating resistance was about ten (10) ohms. The transducers are characterized by using the "crossed-field" model as proposed by Smith et. al. in: *Analysis of Interdigital Surface Wave Transducers by use of an Equivalent Circuit Model*, IEEE Trans. on Microwave Theory & Techniques, Vol. MTT-17, No. 11, November 1969.

Thus, there has been shown and described an improved monolithic SAW bandpass filter with very low insertion loss. With such a design, multiple-pole filters can be built across a wide bandwidth range. Such a design also minimizes the number of elements necessary in a filter and provides for a monolithic device with no electrical crossovers on the substrate, a feature which can become increasing important at higher frequencies. The simplicity and compactness of this particular design is new to filters for cellular telephones and trunked radios.

While there have been shown and described what are at present considered the preferred embodiments of the invention, it will be obvious to those skilled in the art that various changes and modifications may be made therein without departing from the scope of the invention as defined by the appended claims.

What is claimed is:

1. A bandpass filter comprising:
   a monolithic piezoelectric substrate; and
   first and second dual port SAW devices disposed on said substrate and coupled in a full lattice circuit configuration, the first lead of the input of said filter being coupled to the second inputs of said first and second SAW devices and the second lead of the input of said filter being coupled to the first inputs of said first and second devices, the first output of said first device being coupled to the second output of said second device to form the first lead of the filter output, and the first output of said second device being coupled to the second output of said first device to form the second lead of the filter output.

2. The bandpass filter according to claim 1 wherein said dual port SAW devices comprise dual port SAW transducers.

3. The bandpass filter according to claim 1 wherein said dual port SAW devices comprise dual port SAW resonators.

4. The bandpass filter according to claim 1 wherein said first dual port SAW device comprises two dual port SAW transducers coupled in parallel.

5. The bandpass filter according to claim 1 wherein said first SAW device comprises a plurality of dual port SAW transducers coupled in parallel and said second SAW device comprises a plurality of dual port SAW transducers coupled in parallel.

6. The bandpass filter according to claim 2 wherein said second dual port SAW device is comprised of two capacitors.

7. The bandpass filter according to claim 1 wherein the input and output of said filter are coupled to external push pull circuits.

8. The bandpass filter according to claim 4 wherein said filter is a four pole filter that has the frequencies shifted to minimize passband ripple.

9. A bandpass filter comprising:
a monolithic piezoelectric substrate;
and a first and second set of elements disposed on said substrate and coupled in a cascaded circuit configuration, each of said set of elements comprised of a first and second dual port SAW device electrically coupled to one another, said first set of elements coupled to the input of said filter and coupled to said second set of elements, said second set of elements being coupled to the output o said filter.

10. The bandpass filter according to claim 9 wherein the outputs of said first and second SAW devices of each said first and second set of elements are coupled to one another, and wherein said first and second set of elements are electrically coupled by coupling one input of each of said second SAW devices and coupling the outputs of said SAW devices.

11. The bandpass filter according to claim 10 wherein said filter may include a plurality of sets of dual port SAW devices disposed on said substrate and coupled in a cascaded circuit configuration.

12. The bandpass filter according to claim 10 wherein said dual port SAW devices comprise dual port SAW transducers.

13. The bandpass filter according to claim 10 wherein said dual port SAW devices comprise dual port SAW resonators.

14. The bandpass filter according to claim 10 wherein said first dual port SAW device comprises two dual port SAW transducers coupled in parallel.

15. The bandpass filter according to claim 10 wherein said first SAW device comprises a plurality of dual port SAW transducers coupled in parallel and said second SAW device comprises a plurality of dual port SAW transducers coupled in parallel.

16. The bandpass filter according to claim 10 wherein a capacitive element is included between said cascaded first and second sets of elements.

17. The bandpass filter according to claim 14 wherein said filter is a four pole filter that has the frequencies shifted in said two sets of elements to minimize passband ripple.

* * * * *